United States Patent
Park

(10) Patent No.: US 8,952,366 B2
(45) Date of Patent: Feb. 10, 2015

(54) ORGANIC ELECTROLUMINESCENT DISPLAY

(71) Applicant: Samsung Display Co., Ltd., Yongin, Gyeonggi-Do (KR)

(72) Inventor: Joung Keun Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/841,354

(22) Filed: Mar. 15, 2013

(65) Prior Publication Data
US 2014/0158995 A1 Jun. 12, 2014

(30) Foreign Application Priority Data
Dec. 12, 2012 (KR) .................. 10-2012-0144670

(51) Int. Cl.
*H01L 29/08* (2006.01)
*H01L 27/32* (2006.01)
*H01L 27/12* (2006.01)

(52) U.S. Cl.
CPC ........ *H01L 27/3279* (2013.01); *H01L 27/3262* (2013.01); *H01L 27/3265* (2013.01); *H01L 27/124* (2013.01); *H01L 27/1255* (2013.01)
USPC ............................................. 257/40; 257/59

(58) Field of Classification Search
CPC ............ H01L 27/3265; H01L 27/3279; G02F 1/136213
USPC ................................................ 257/40, 59
See application file for complete search history.

(56) References Cited

U.S. PATENT DOCUMENTS

| | | |
|---|---|---|
| 2006/0008932 A1 | 1/2006 | Oh et al. |
| 2007/0103610 A1* | 5/2007 | Lee et al. ............... 349/38 |
| 2008/0079005 A1* | 4/2008 | Tseng ..................... 257/72 |
| 2010/0255619 A1 | 10/2010 | Kwon et al. |

FOREIGN PATENT DOCUMENTS

| | | |
|---|---|---|
| KR | 10-2005-0098122 A | 10/2005 |
| KR | 10-2009-0048823 A | 5/2009 |
| KR | 10-2010-0110125 A | 10/2010 |

* cited by examiner

*Primary Examiner* — David Vu
*Assistant Examiner* — Brandon Fox
(74) *Attorney, Agent, or Firm* — Christie, Parker & Hale, LLP

(57) ABSTRACT

An organic electroluminescent display includes a first substrate, a pixel, a gate line, a data line, a switching transistor, a power signal line, a driving transistor, and a storage capacitor. The storage capacitor includes first, second, and third electrodes. The first electrode is on the first substrate, and the second electrode includes the same material as the gate line. The second electrode is on the first electrode and insulated from the first electrode. The third electrode is insulated from and on the second electrode, and the third electrode is insulated from the first electrode.

18 Claims, 6 Drawing Sheets

ORGANIC ELECTROLUMINESCENT DISPLAY

CROSS-REFERENCE TO RELATED APPLICATION

This application claims priority to and the benefit of Korean Patent Application No. 10-2012-0144670, filed on Dec. 12, 2012, in the Korean Intellectual Property Office, the entire contents of which are incorporated herein by reference.

BACKGROUND

1. Field

Embodiments of the present invention relate to an organic electroluminescent display having an improved display quality.

2. Description of the Related Art

In recent years, an organic electroluminescent display has been spotlighted as a next generation display device because it has a superior viewing angle and brightness and does not need a separate light source, as compared to a liquid crystal display device. Accordingly, the organic electroluminescent display is slim and lightweight. In addition, the organic electroluminescent display has a fast response speed, low driving voltage, and high brightness.

In general, an organic electroluminescent display includes an organic light emitting diode including an anode electrode, a cathode electrode, and an organic light emitting layer between the anode electrode and the cathode electrode. Holes and electrons are injected into the organic emitting layer through the anode electrode and the cathode electrode, and are recombined in the organic light emitting layer to generate excitons (electron-hole pairs). The excitons emit energy, which is discharged when an excited state returns to a ground state, as light. An organic electroluminescent display may include a plurality of organic light emitting diodes arranged in a matrix to display an image.

Organic electroluminescent displays are increasing in size, and thus, lengths of signal lines used to transmit various signals to pixels of the organic electroluminescent display are also increasing. In this case, a resistance of the signal lines increases and the signals are delayed, thereby causing deterioration in display quality of the organic electroluminescent display.

SUMMARY

Embodiments of the present invention provide an organic electroluminescent display having an improved display quality.

Embodiments of the present invention provide an organic electroluminescent display including a first substrate, a pixel on the first substrate, a gate line on the first substrate configured to transmit a gate signal, a data line on the first substrate configured to transmit a data signal, a switching transistor electrically connected to the gate line and the data line, a power signal line on the first substrate configured to transmit a power signal, a driving transistor electrically connected to the switching transistor and the power signal line to drive the pixel, and a storage capacitor electrically connected to the switching transistor and the driving transistor.

The storage capacitor includes a first electrode, a second electrode, and a third electrode. The first electrode is on the first substrate. The second electrode is insulated from and on the first electrode, and the second electrode includes the same material as the gate line. The third electrode is insulated from the second electrode, on the second electrode, and electrically connected to the first electrode.

The gate electrode of each of the switching transistor and the driving transistor may include a material different from that of the gate line, and thus, the gate electrode of each of the switching transistor and the driving transistor and the gate line may be formed in different processes. Accordingly, the resistance of the gate line may be easily reduced by increasing the thickness of the gate line regardless of the thickness of the gate electrode. Therefore, the gate signal may be prevented from being delayed due to the resistance of the gate line, thereby improving the display quality of the organic electroluminescent display.

In addition, a size of the storage capacitor may be reduced while maintaining a suitable capacitance of the storage capacitor according to the structure of the first, second, and third electrodes of the storage capacitor. Accordingly, because the size of the pixel may be increased due to the reduced size of the storage capacitor, the amount of the light exiting from the pixel may increase, thereby improving the display quality of the organic electroluminescent display.

BRIEF DESCRIPTION OF THE DRAWINGS

The above and other features of the present invention will become apparent by reading the following detailed description in conjunction with the accompanying drawings wherein.

DETAILED DESCRIPTION

Figure 1:
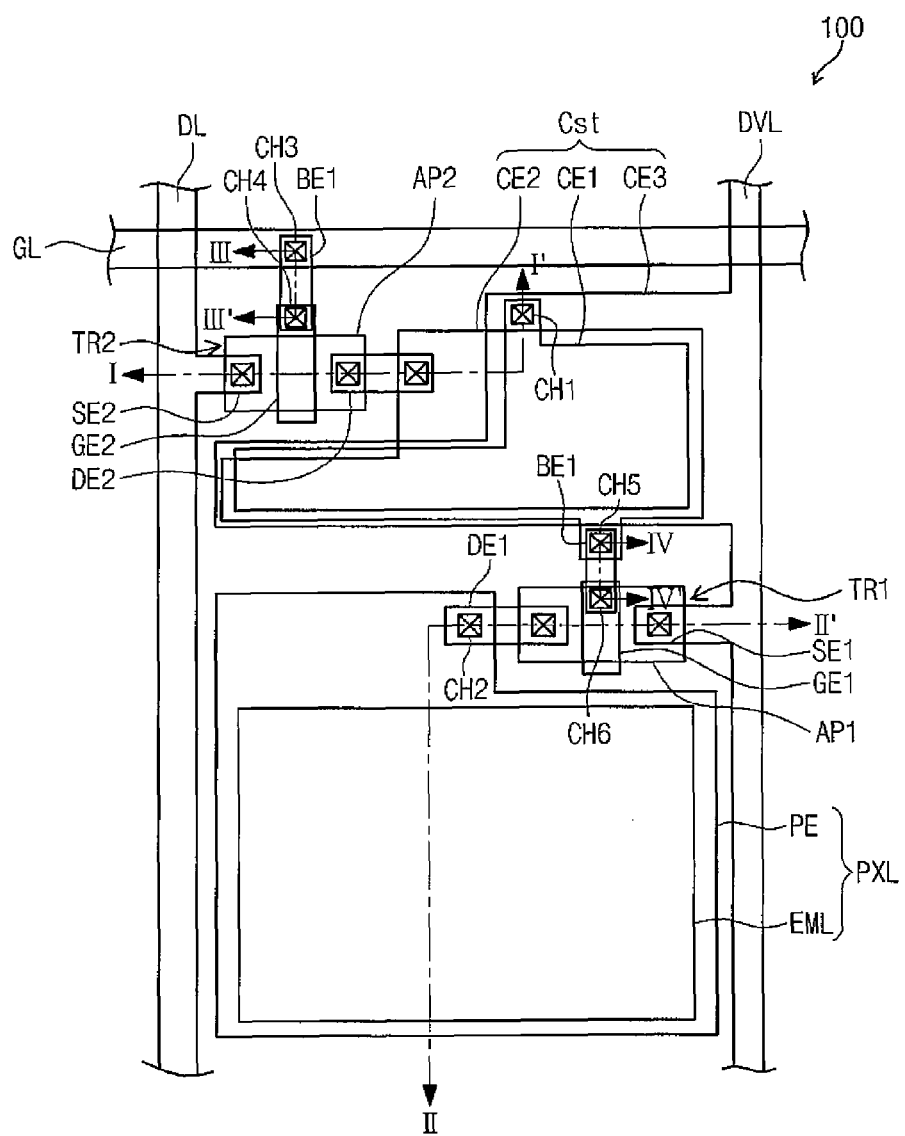
FIG. 1 is a plan view illustrating a pixel of an organic electroluminescent display according to an embodiment of the present invention.

When an element or layer is referred to as being "on", "connected to" or "coupled to" another element or layer, it can be directly on, connected or coupled to the other element or layer or one or more intervening elements or layers may also be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 2A:
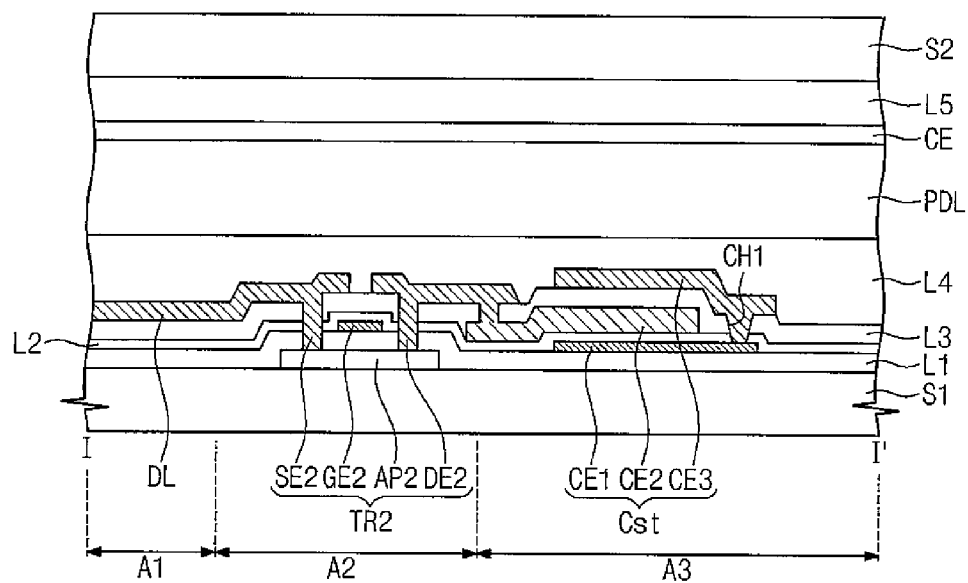
FIG. 2A is a cross-sectional view taken along the line I-I' of FIG. 1.
Figure 2B:
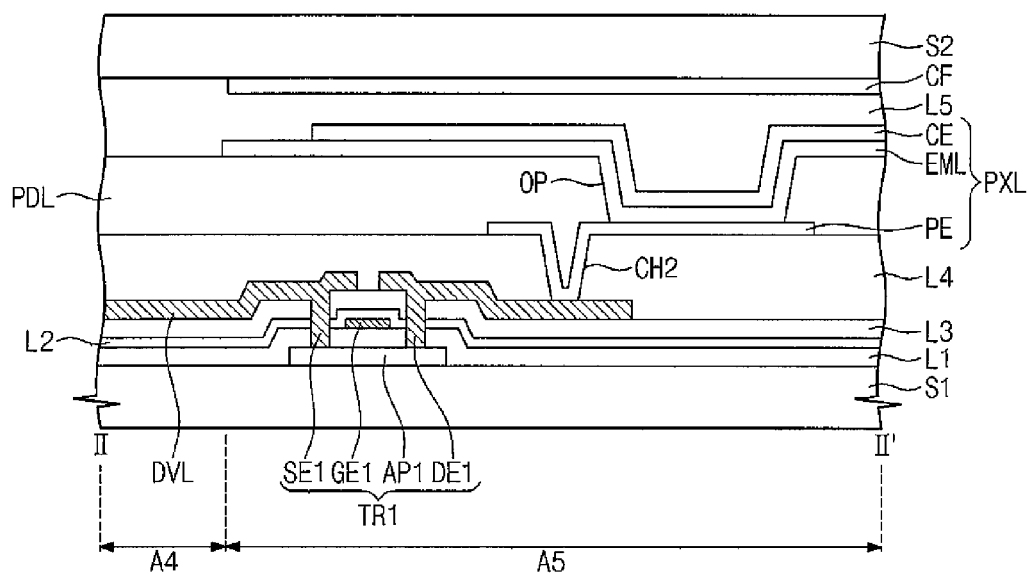
FIG. 2B is a cross-sectional view taken along the line II-II' of FIG. 1.

FIG. 1 is a plan view illustrating a pixel of an organic electroluminescent display according to an embodiment of the present invention, FIG. 2A is a cross-sectional view taken along the line I-I' of FIG. 1, and FIG. 2B is a cross-sectional view taken along the line II-II' of FIG. 1.

Referring to FIGS. 1, 2A, and 2B, the organic electroluminescent display 100 includes a plurality of pixels. In the present embodiment, only one pixel PXL among the pixels will be described in detail as a representative example.

The organic electroluminescent display 100 includes a first substrate S1, a second substrate S2, a gate line GL, a data line DL, a power signal line DVL, a driving transistor TR1, a switching transistor TR2, a storage capacitor Cst, and the pixel PXL.

The first and second substrates S1 and S2 face each other. In the present embodiment, the first and second substrates S1 and S2 may be a glass or plastic substrate, but are not limited thereto. For example, according to an embodiment, the first and second substrates S1 and S2 may be a metal substrate. When each of the first and second substrates S1 and S2 is a plastic or metal substrate, the first and second substrates S1 and S2 may be flexible.

The first substrate S1 may include first, second, third, fourth, fifth, and sixth areas A1, A2, A3, A4, A5, and A6. According to an embodiment of the present invention, the data line DL is in the first area A1, the switching transistor TR2 is in the second area A2, the storage capacitor Cst is in the third area A3, the power signal line DVL is in the fourth area A4, the pixel PXL is in the fifth area A5, and the gate line GL is in the sixth area A6.

The gate line GL and the data line DL may be insulated from each other by an inter-insulating layer L3 interposed therebetween, and the gate line GL and the data line DL are extended in different directions to overlap each other. The gate line GL transmits a gate signal, the data line DL transmits a data signal, and the gate line GL and the data line DL are electrically connected to the switching transistor TR2.

The switching transistor TR2 is electrically connected to the gate line GL and the data line DL and receives the gate signal and the data signal through the gate line GL and the data line DL, respectively. The switching transistor TR2 includes a second active pattern AP2, a second gate electrode GE2, a second source electrode SE2, and a second drain electrode DE2.

The second active pattern AP2 is on the first substrate S1 and includes a semiconductor material. In the present embodiment, the second active pattern AP2 includes amorphous silicon and/or crystalline silicon, but it should not be limited thereto. For example, the second active pattern AP2 may include an oxide semiconductor, such as IGZO, ZnO, $SnO_2$, $In_2O_3$, $Zn_2SnO_4$, $Ge_2O_3$, $HfO_2$, etc., or include a compound semiconductor, such as GaAs, GaP, InP, etc.

The second gate electrode GE2 is electrically connected to the gate line GL to receive the gate signal through the gate line GL. The second gate electrode GE2 may be spaced apart from the gate line GL and electrically connected to the gate line GL by a first connection electrode BE1 (refer to FIG. 3). This will be described in detail with reference to FIG. 3.

The second source electrode SE2 is electrically connected to the data line DL to receive the data signal from the data line DL, and the second drain electrode DE2 is spaced apart from the second source electrode SE2. Each of the second source electrode SE2 and the second drain electrode DE2 may electrically connect to the second active pattern AP2 through contact holes penetrating through a gate insulating layer L2 and the inter-insulating layer L3. The second drain electrode DE2 is electrically connected to the storage capacitor Cst and the driving transistor TR1.

Accordingly, when the switching transistor TR2 is turned on in response to the gate signal applied to the second gate electrode GE2 through the gate line GL, the data signal provided through the data line DL is applied to a storage capacitor Cst and the driving transistor TR1 after sequentially passing through the second source electrode SE2, the second active pattern AP2, and the second drain electrode DE2.

In the present embodiment, the second gate electrode GE2 includes a first conductive material and the gate line GL includes a second conductive material having a specific resistance lower than that of the first conductive material. As an example, the first conductive material may include molybdenum, aluminum, nickel, an aluminum alloy, or an alloy including two or more metal materials, and the second conductive material includes copper. Therefore, although the gate line GL is formed in a linear shape, the gate signal may be prevented from being delayed due to the resistance of the gate line GL.

When the gate line GL and the second gate electrode GE2 include different conductive materials (as compared to each other), the gate line GL and the second gate electrode GE2 may be formed in different processes. Thus, the resistance of the gate line GL may be easily reduced by increasing a thickness of the gate line GL regardless of a thickness of the second gate electrode GE2. For example, the thickness of the second gate electrode GE2 may be in a range from about 300 angstroms to about 1000 angstroms, and the thickness of the gate line GL may be in a range from about 5000 angstroms to about 20000 angstroms.

In other words, the thickness of the second gate electrode GE2 may be easily reduced regardless of the increase in the thickness of the gate line GL.

In an embodiment where the gate line GL and the second gate electrode GE2 have the same thickness (e.g., by increasing the thickness of the gate line GL and the second gate electrode GE2), the thickness of the gate insulating layer L2 covering the second gate electrode GE2 is increased to prevent the gate insulating layer L2 from being cracked. As a result, a process time required to deposit the gate insulating layer L2 becomes long and a profile of the second gate electrode GE that is smaller than the gate line GL may be difficult to precisely control.

In the present embodiment however, because the gate line GL and the second gate electrode GE2 include different materials and are formed in different processes, the thickness of the second gate electrode GE2 may be easily controlled, thereby easily manufacturing the switching transistor TR2.

According to the present embodiment, the storage capacitor Cst is electrically connected to the switching transistor TR2 and the power signal line DVL. The storage capacitor Cst is charged with a voltage corresponding to a difference between a voltage corresponding to the data signal from the switching transistor TR2 and a voltage corresponding to a power signal from the power signal line DVL. The voltage charged in the storage capacitor Cst is applied to the driving transistor TR1.

In the present embodiment, the storage capacitor Cst includes a first electrode CE1, a second electrode CE2 on the first electrode CE1, and a third electrode CE3 on the second electrode CE2. The gate insulating layer L2 is interposed between the first and second electrodes CE1 and CE2 to insulate the first and second electrodes CE1 and CE2 from each other, and the inter-insulating layer L3 is interposed between the second and third electrodes CE2 and CE3 to insulate the second and third electrodes CE2 and CE3 from each other.

The second electrode CE2 may be electrically connected to the second drain electrode DE2 through a contact hole formed through the inter-insulating layer L3, and the third electrode CE3 may be electrically connected to the power signal line DVL and extended from the power signal line DVL.

In an embodiment, a first contact hole CH1 may be formed penetrating through the gate insulating layer L2 and the inter-insulating layer L3, and the first and third electrodes CE1 and CE3 may be electrically connected to each other through the first contact hole CH1. In the present embodiment, the first and third electrodes CE1 and CE3 are operated as one electrode in the storage capacitor Cst. As a result, a capacitance of the storage capacitor Cst is increased in proportion to an area in which the first, second, and third electrodes CE1, CE2, and CE3 overlap each other. Accordingly, sizes of the first, second, and third electrodes CE1 to CE3 are reduced (e.g., reduced proportional to the increase of the capacitance) when the storage capacitor Cst is configured in the above-mentioned configuration. Thus, the fourth area A5 (in which the pixel PXL is located (or disposed)), may be increased due to the reduction of the third area A3 (in which the storage capacitor Cst is located (or disposed)), thereby increasing an amount of the light exiting from the pixel PXL.

According to an embodiment of the present invention, the first electrode CE1 includes the first conductive material, and the second electrode CE2 includes the second conductive material. Accordingly, the first electrode CE1 may be formed together with the second gate electrode GE2, and the second electrode CE2 may be formed together with the gate line GL.

The driving transistor TR1 is electrically connected to the switching transistor TR2, the power signal line DVL, and the pixel PXL. The driving transistor TR1 switches a power signal applied to the pixel PXL from the power signal line DVL. The driving transistor TR1 includes a first active pattern AP1, a first gate electrode GE1, a first source electrode SE1, and a first drain electrode DE1.

The first active pattern AP1 is on the first substrate S1 and includes a semiconductor material. In the present embodiment, the first active pattern AP1 includes amorphous silicon and/or crystalline silicon, but is not limited thereto. For example, the first active pattern AP1 may include an oxide semiconductor, such as IGZO, ZnO, $SnO_2$, $In_2O_3$, $Zn_2SnO_4$, $Ge_2O_3$, $HfO_2$, etc., or include a compound semiconductor, such as GsAs, GaP, InP, etc.

The first gate electrode GE1 is electrically connected to the second drain electrode DE2 of the switching transistor TR2 through the second electrode CE2. Accordingly, when the switching transistor TR2 is turned on and the data signal is applied to the first gate electrode GE1 through the turned-on switching transistor TR2, the driving transistor TR1 is turned on according to the data signal.

Figure 4:
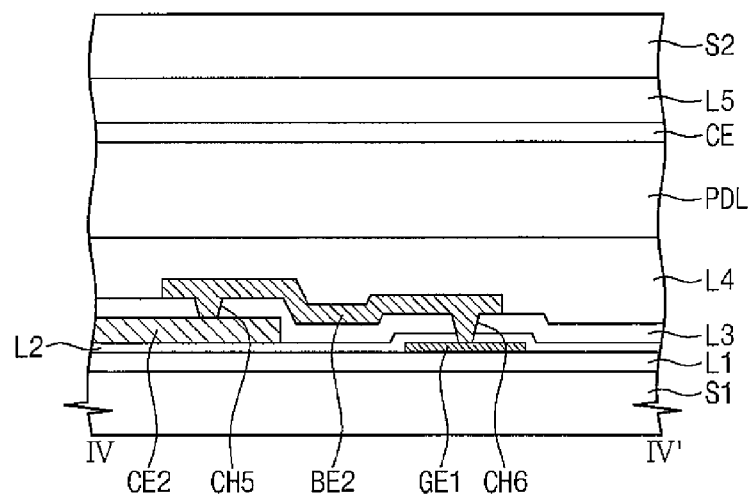
FIG. 4 is a cross-sectional view taken along the line IV-IV' of FIG. 1.

The first gate electrode GE1 is spaced apart from the second electrode CE2 and electrically connected to the second electrode CE2 by a second connection electrode BE2 (refer to FIG. 4). This will be described in detail with reference to FIG. 4.

The first source electrode SE1 is electrically connected to the power signal line DVL to receive the power signal from the power signal line DVL. The first drain electrode DE1 is spaced apart from the first source electrode SE1 and is electrically connected to the pixel PXL. According to an embodiment of the present invention, each of the first source electrode SE1 and the first drain electrode DE1 contacts the first active pattern AP1 through contact holes formed penetrating through the gate insulating layer L2 and the inter-insulating layer L3. Accordingly, when the driving transistor TR1 is turned on, the power signal is applied to the pixel PXL (e.g., applied in proportion to a data signal) after sequentially passing through the first source electrode SE1, the first active pattern AP1, and the first drain electrode DE1.

In the present embodiment, the first gate electrode GE1 includes the first conductive material and the gate line GL includes the second conductive material. Accordingly, the gate line GL and the first gate electrode GE1 may be formed in different processes. Thus, the thickness of the first gate electrode GE1 may be easily controlled regardless of the thickness of the gate line GL. For instance, as described above, when the thickness of the gate line GL is in a range from about 5000 angstroms to about 20000 angstroms, the thickness of the first gate electrode GE1 may be in a range from about 300 angstroms to about 1000 angstroms.

The pixel PXL includes the pixel electrode PE, an organic light emitting layer EML, and a common electrode CE. The pixel electrode PE may be an anode electrode of the pixel PXL and the common electrode CE may be a cathode electrode of the pixel PXL. The pixel electrode PE may be on a planarization layer L4 that covers the driving transistor TR1 and the switching transistor TR2, and the pixel electrode PE may be electrically connected to the first drain electrode DE1 through a second contact hole CH2 penetrating through the planarization layer L4.

A pixel definition layer PDL is on the pixel electrode PE and has an opening portion OP formed therein, and the organic light emitting layer EML is on the pixel definition layer PDL. The organic light emitting layer EML contacts the pixel electrode PE through the opening portion OP formed through the pixel definition layer PDL. In the present embodiment, the organic light emitting layer EML has a shape corresponding to the fifth area A5 of the first substrate S1, however, the organic light emitting layer EML may be formed in a single layer to cover the entire area of the first substrate S1.

The common electrode CE is on the organic light emitting layer EML to be applied with a common voltage. Accordingly, electrons and holes, which are respectively provided from the common electrode CE and the pixel electrode PE, are recombined with each other in the organic light emitting layer EML, so that light is emitted from the organic light emitting layer EML.

The second substrate S2 is coupled with the first substrate S1 with a cover layer L5 interposed therebetween. The cover layer L5 covers the pixel PXL to prevent humidity (e.g., moisture) and gas (e.g., oxygen) from inflowing into the pixel PXL.

A color filter CF may be on the second substrate S2. The color filter CF filters a white light emitted from the organic light emitting layer EML to produce a colored light. According to an embodiment of the present invention, the organic light emitting layer EML may emit colored light, and thus, the color filter CF may be omitted as shown in FIG. 5B.

Figure 3:
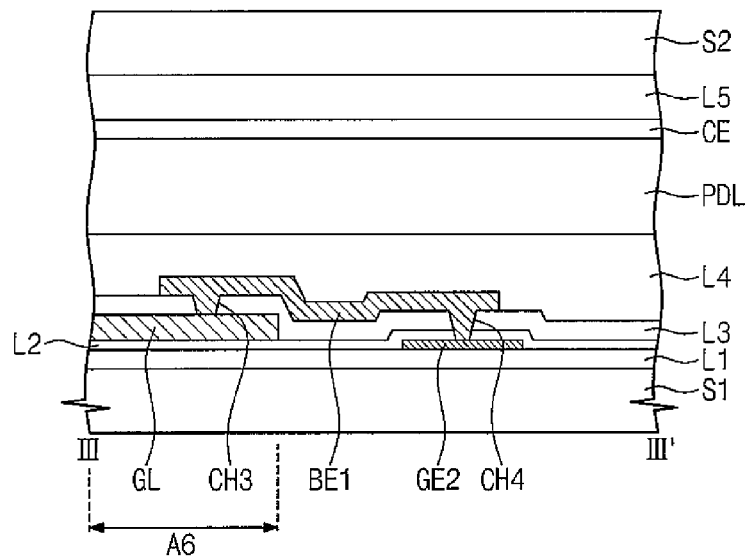
FIG. 3 is a cross-sectional view taken along the line III-III' of FIG. 1.

FIG. 3 is a cross-sectional view taken along the line III-III' of FIG. 1. In FIG. 3, the same reference numerals denote the same elements as included in FIGS. 1, 2A, and 2B, and thus, detailed descriptions of these same elements are given by way of reference to their above-description.

Referring to FIGS. 1 and 3, the gate line GL is in the sixth area A6 of the first substrate S1 and the inter-insulating layer L3 is on the gate line GL. The gate line GL is spaced apart from the second gate electrode GE2, and the gate insulating layer L2 and the inter-insulating layer L3 are on the second gate electrode GE2. A third contact hole CH3 is formed penetrating through the inter-insulating layer L3 to correspond to the gate line GL and a fourth contact hole CH4 is formed penetrating through the gate insulating layer L2 and the inter-insulating layer L3 to correspond to the second gate electrode GE2.

The first connection electrode BE1 is on the inter-insulating layer L3 to overlap with the gate line GL and the second gate electrode GE2. Thus, the first connection electrode BE1 contacts the gate line GL and the second gate electrode GE2 through the third and fourth contact holes CH3 and CH4, so that the gate line GL and the second gate electrode GE2 are electrically connected to each other through the first connection electrode BE1.

FIG. 4 is a cross-sectional view taken along the line IV-IV' of FIG. 1. In FIG. 4, the same reference numerals denote the same elements as illustrated in FIGS. 1, 2A, and 2B, and thus, detailed descriptions of these same elements will be given by way of reference to their above-description.

Referring to FIGS. 1 and 4, the second electrode CE2 is on the first substrate S1 and the inter-insulating layer L3 is on the second electrode CE2. The first gate electrode GE1 is on the first substrate S1 and spaced apart from the second electrode CE2, and the gate insulating layer L2 and the inter-insulating layer L3 are on the first gate electrode GE1. A fifth contact hole CH5 is formed penetrating through the inter-insulating layer L3 to correspond to the second electrode CE2 and a sixth contact hole CH6 is formed penetrating through the gate insulating layer L2 and the inter-insulating layer L3 to correspond to the first gate electrode GE1.

The second connection electrode BE2 is on the inter-insulating layer L3 to overlap with the second electrode CE2 and the first gate electrode GE1. Thus, the second connection electrode BE2 contacts the second electrode CE2 and the first gate electrode GE1 through the fifth and sixth contact holes CH5 and CH6, so that the second electrode CE2 and the first gate electrode GE1 are electrically connected to each other through the second connection electrode BE2.

Figure 5A:
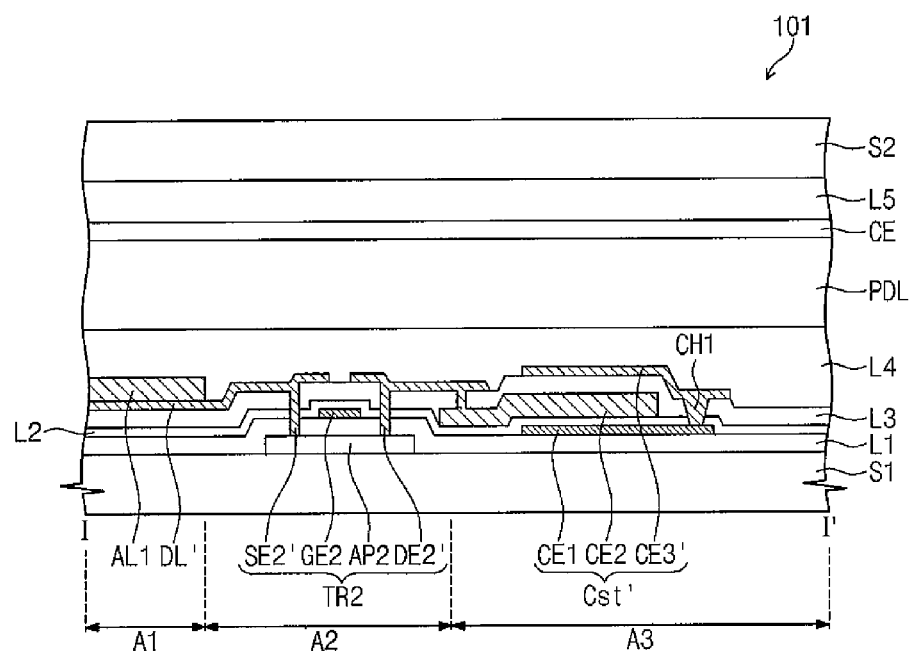
FIGS. 5A and 5B are cross-sectional views illustrating an organic electroluminescent display according to another embodiment of the present invention.
Figure 5B:
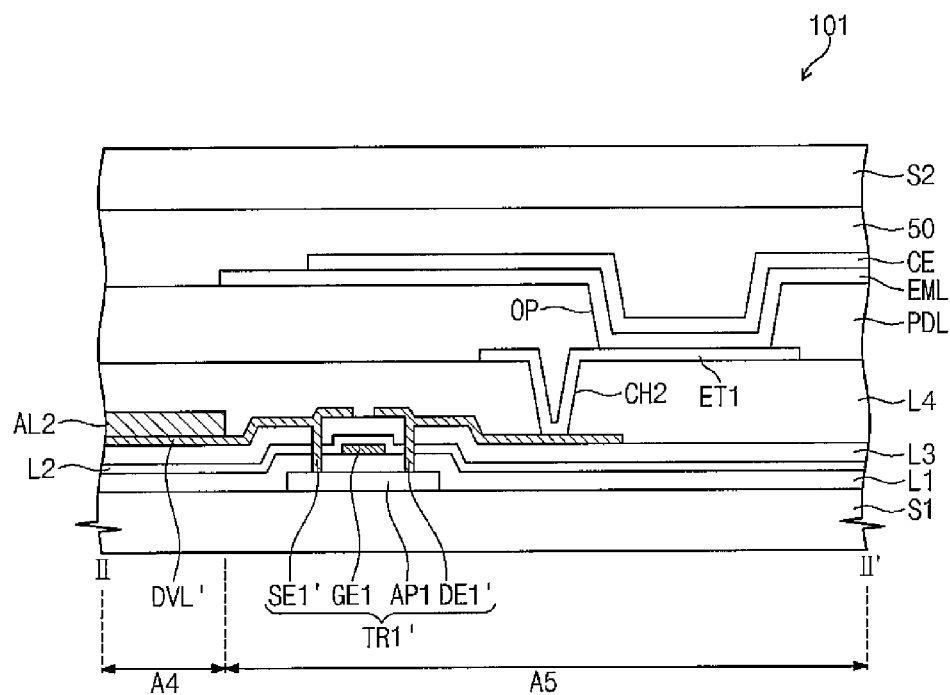

FIGS. 5A and 5B are cross-sectional views showing an organic electroluminescent display according to another embodiment of the present invention. In detail, the cross-sectional view of the organic electroluminescent display 101 shown in FIG. 5A corresponds to the cross-sectional view of the organic electroluminescent display 100 shown in FIG. 1, which is taken along the line I-I' of FIG. 1, and the cross-sectional view of the organic electroluminescent display 101 shown in FIG. 5B corresponds to the cross-sectional view of the organic electroluminescent display 100 shown in FIG. 1, which is taken along the line II-II' of FIG. 1. In FIGS. 5A and 5B, the same reference numerals denote the same elements in FIGS. 1, 2A, 2B, 3, and 4, and thus detailed descriptions of these same elements will be given by way of reference to their above descriptions.

Referring to FIGS. 5A and 5B, the organic electroluminescent display 101 further includes a first auxiliary line AL1 and a second auxiliary line AL2 as compared to the organic electroluminescent display 100 shown in FIG. 1.

A data line DL' may be in the first area A1 of the first substrate S1, the first auxiliary line AL1 is located on the data line DL' to overlap with the data line DL', and the first auxiliary line AL1 contacts the data line DL' to be electrically connected to the data line DL'. The data line DL' and the first auxiliary line AL1, which are electrically connected to each other, are referred to as a double-layered data line. The double-layered data line may perform the same function as that of the data line DL shown in FIG. 2A. Because the double-layered data line has a resistance smaller than that of the data line DL shown in FIG. 2A due to the first auxiliary line AL1, the data signal transmitting through the double-layered data line may be effectively prevented from being delayed.

According to the present embodiment, a power signal line DVL' is in the fourth area A4 of the first substrate S1 and the second auxiliary line AL2 is on the power signal line DVL'. The second auxiliary line AL2 is overlapped with the power signal line DVL' and contacts the power signal line DVL', and thus, the second auxiliary line AL2 is electrically connected to the power signal line DVL'. The power signal line DVL' and the second auxiliary line AL2, which are electrically connected to each other, are referred to as a double-layered power signal line. The double-layered power signal line may perform the same function as that of the power signal line DVL shown in FIG. 2B. Since the double-layered power signal line has a resistance smaller than that of the power signal line DVL shown in FIG. 2B due to the second auxiliary line AL2, the power signal transmitting through the double-layered power signal line may be effectively prevented from being delayed.

In the present exemplary embodiment, the data line DL' and the power signal line DVL' include a first conductive material and the first and second auxiliary lines AL1 and AL2 include a second conductive material having a specific resistance lower than that of the first conductive material. As an example, the first conductive material may include molybdenum, aluminum, nickel, an aluminum alloy, or an alloy including two or more metal materials, and the second conductive material includes copper.

Each of the data line DL' and the power signal line DVL' may have a thickness of about 300 angstroms to about 1000 angstroms, and each of the first and second auxiliary lines AL1 and AL2 may have a thickness of about 5000 angstroms to about 20000 angstroms.

A switching transistor TR2' is in the second area A2 of the first substrate S1 and includes a second active pattern AP2, a second gate electrode GE2, a second source electrode SE2', and a drain electrode DE2'. In the present embodiment, the second source electrode SE2' and the second drain electrode DE2' include the first conductive material. Each of the second gate electrode GE2, the second source electrode SE2', and the second drain electrode DE2' may have a thickness of about 300 angstroms to about 1000 angstroms.

A driving transistor TR1' is in the fifth area A5 of the first substrate S1 and includes a first active pattern AP1, a first gate electrode GE1, a first source electrode SE1', and a first drain electrode DE1'. In the present embodiment, the first source electrode SE1' and the first drain electrode DE1' include the first conductive material. Each of the first source electrode SE1' and the first drain electrode DE1' may have a thickness of about 300 angstroms to about 1000 angstroms.

Although exemplary embodiments of the present invention have been described, the present invention should not be limited to these exemplary embodiments but various changes and modifications may be made by one ordinary skilled in the art within the spirit and scope of the present invention as hereinafter claimed.

What is claimed is:

1. An organic electroluminescent display comprising:
a first substrate;
a pixel on the first substrate;
a gate line on the first substrate configured to transmit a gate signal;
a data line on the first substrate configured to transmit a data signal;
a switching transistor electrically connected to the gate line and the data line;
a power signal line on the first substrate configured to transmit a power signal;
a driving transistor electrically connected to the switching transistor and the power signal line to drive the pixel; and
a storage capacitor electrically connected to the switching transistor and the driving transistor, the storage capacitor comprising:
a first electrode on the first substrate, wherein the first electrode of the storage capacitor comprises a first conductive material;
a second electrode insulated from and on the first electrode, the second electrode comprising a same material as the gate line, wherein the gate line and the second electrode comprise a second conductive material having a specific resistance lower than a specific resistance of the first conductive material; and
a third electrode insulated from the second electrode, the third electrode on the second electrode and electrically connected to the first electrode.

2. The organic electroluminescent display of claim 1, wherein the pixel comprises:
a pixel electrode on the first substrate and electrically connected to the driving transistor;
an organic light emitting layer on the pixel electrode; and
a common electrode on the organic light emitting layer.

3. The organic electroluminescent display of claim 1, wherein the driving transistor comprises:
a first gate electrode comprising the first conductive material and being electrically connected to the second electrode;
a first active pattern overlapping the first gate electrode;
a first source electrode electrically connected to the power signal line and the first active pattern; and
a first drain electrode electrically connected to the first active pattern and the pixel electrode.

4. The organic electroluminescent display of claim 3, wherein the switching transistor comprises:
a second gate electrode comprising the first conductive material and being electrically connected to the gate line;
a second active pattern overlapping the second gate electrode;
a second source electrode electrically connected to the data line and the second active pattern; and
a second drain electrode electrically connected to the first active pattern and the first gate electrode.

5. The organic electroluminescent display of claim 4, wherein the second conductive material comprises copper.

6. The organic electroluminescent display of claim 4, wherein each of the first gate electrode and the second gate electrode has a thickness smaller than a thickness of each of the gate line and the second electrode.

7. The organic electroluminescent display of claim 6, wherein the thickness of each of the first gate electrode and the second gate electrode is in a range from about 300 angstroms to about 1000 angstroms, and
wherein the thickness of each of the gate line and the second electrode is in a range from about 5000 angstroms to about 20000 angstroms.

8. The organic electroluminescent display of claim 6, further comprising:
a gate insulating layer between the first electrode and the second electrode and covering the first gate electrode and the second gate electrode; and
an inter-insulating layer between the second electrode and the third electrode,
wherein the gate insulating layer has a thickness smaller than a thickness of the inter-insulating layer.

9. The organic electroluminescent display of claim 8, wherein the thickness of the gate insulating layer is in a range from about 500 angstroms to about 2000 angstroms.

10. The organic electroluminescent display of claim 4, further comprising a first connection electrode electrically connecting the gate line to the second gate electrode,
wherein the gate line and the second gate electrode are spaced apart from each other.

11. The organic electroluminescent display of claim 4, further comprising a second connection electrode electrically connecting the second electrode to the first gate electrode,
wherein the second electrode and the first gate electrode are spaced apart from each other.

12. The organic electroluminescent display of claim 4, further comprising:
a first auxiliary line overlapped with and electrically connected to the data line; and
a second auxiliary line overlapped with and electrically connected to the power signal line.

13. The organic electroluminescent display of claim 12, wherein the first auxiliary line contacts the data line to electrically connect to the data line, and
wherein the second auxiliary line contacts the power signal line to electrically connect to the power signal line.

14. The organic electroluminescent display of claim 12, wherein each of the first source electrode, the second source electrode, the first drain electrode, and the second drain electrode has a thickness smaller than a thickness of each of the first auxiliary line and the second auxiliary line.

15. The organic electroluminescent display of claim 12, wherein each of the first and second auxiliary lines comprises a conductive material having a specific resistance lower than a specific resistance of a conductive material of each of the first source electrode, the second source electrode, the first drain electrode, and the second drain electrode.

16. The organic electroluminescent display of claim 15, wherein each of the first auxiliary line and second auxiliary line comprises copper.

17. The organic electroluminescent display of claim 4, wherein the first and second active patterns comprise an oxide semiconductor.

18. The organic electroluminescent display of claim 1, further comprising a color filter on the first substrate or a second substrate to filter a light emitted from an organic light emitting layer.

* * * * *